(12) United States Patent
Ito

(10) Patent No.: US 7,129,581 B2
(45) Date of Patent: Oct. 31, 2006

(54) SEMICONDUCTOR DEVICE, METHOD OF MANUFACTURING THEREOF, CIRCUIT BOARD AND ELECTRONIC APPARATUS

(75) Inventor: Haruki Ito, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/013,141

(22) Filed: Dec. 15, 2004

(65) Prior Publication Data

US 2005/0133937 A1 Jun. 23, 2005

(30) Foreign Application Priority Data

Dec. 17, 2003 (JP) ............... 2003-419405

(51) Int. Cl.
*H01L 23/48* (2006.01)
*H01L 23/52* (2006.01)

(52) U.S. Cl. .............. 257/758; 257/780; 257/781; 257/784; 257/693; 257/738

(58) Field of Classification Search ............... 257/684, 257/687, 693, 731, 734, 735, 737, 738, 750, 257/758, 762, 773, 774–776, 780–782, 784, 257/786, 787, 790, E23.038, E23.055
See application file for complete search history.

(56) References Cited

U.S. PATENT DOCUMENTS

| | | | | |
|---|---|---|---|---|
| 5,604,379 A | * | 2/1997 | Mori | 257/738 |
| 5,726,489 A | * | 3/1998 | Matsuda et al. | 257/659 |
| 5,753,974 A | * | 5/1998 | Masukawa | 257/737 |
| 6,054,773 A | * | 4/2000 | Ohsawa et al. | 257/783 |
| 6,175,153 B1 | * | 1/2001 | Yamada | 257/737 |
| 6,344,696 B1 | * | 2/2002 | Nakamura et al. | 257/786 |
| 6,512,298 B1 | * | 1/2003 | Sahara et al. | 257/773 |
| 6,515,371 B1 | * | 2/2003 | Akiyama et al. | 257/778 |
| 6,841,873 B1 | * | 1/2005 | Yoshida et al. | 257/738 |
| 6,987,031 B1 | * | 1/2006 | Eng et al. | 438/108 |
| 2001/0020737 A1 | * | 9/2001 | Kwon et al. | 257/678 |
| 2004/0169287 A1 | * | 9/2004 | Honda | 257/778 |

FOREIGN PATENT DOCUMENTS

| | | |
|---|---|---|
| EP | 0917 195 A1 | 5/1999 |
| EP | 1198 003 A1 | 4/2002 |
| JP | 11-26634 | 1/1999 |
| WO | WO 98/25297 | 6/1998 |
| WO | WO 98/25298 | 6/1998 |
| WO | WO 00/55898 | 9/2000 |

OTHER PUBLICATIONS

Examination result issued in corresponding Chinese Patent application.

* cited by examiner

*Primary Examiner*—Jasmine Clark
(74) *Attorney, Agent, or Firm*—Harness, Dickey & Pierce, P.L.C.

(57) ABSTRACT

A semiconductor device is provided comprising: a semiconductor element including a plurality of electrodes; a plurality of resin layers; a plurality of wirings; and a plurality of external terminals coupled to the wirings. First wirings of the plural wirings are formed at the bottom of a first resin layer and second wirings are formed at the top of the first resin layer.

11 Claims, 6 Drawing Sheets

FIG. 2
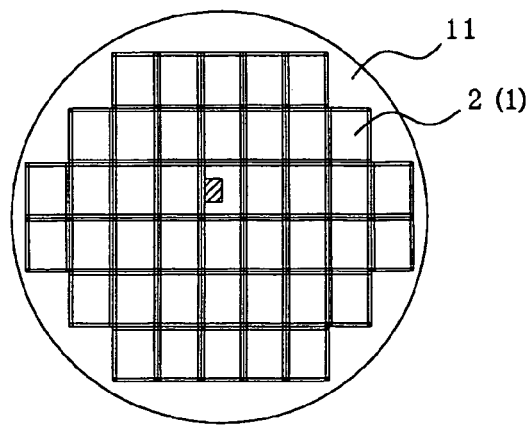
FIG. 3 (a1)
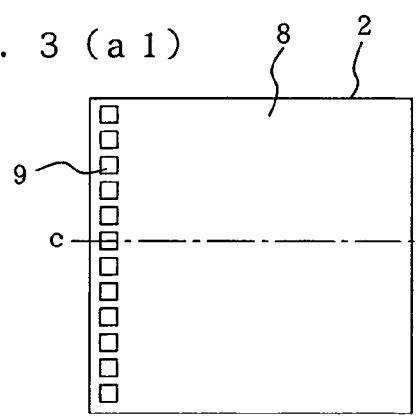
FIG. 3 (a2)
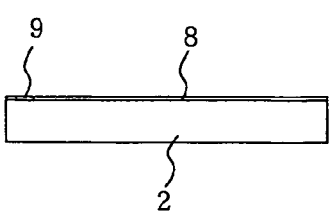
FIG. 3 (b1)
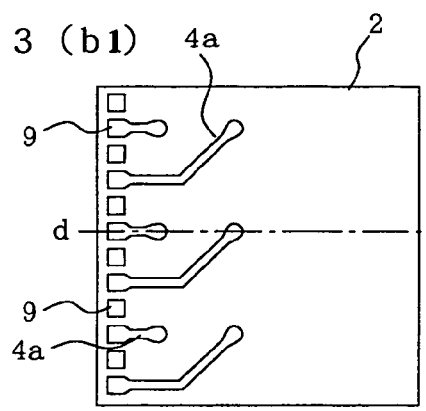
FIG. 3 (b2)
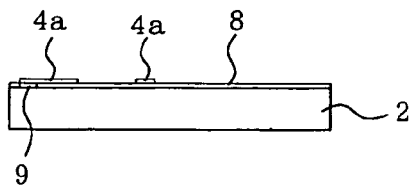

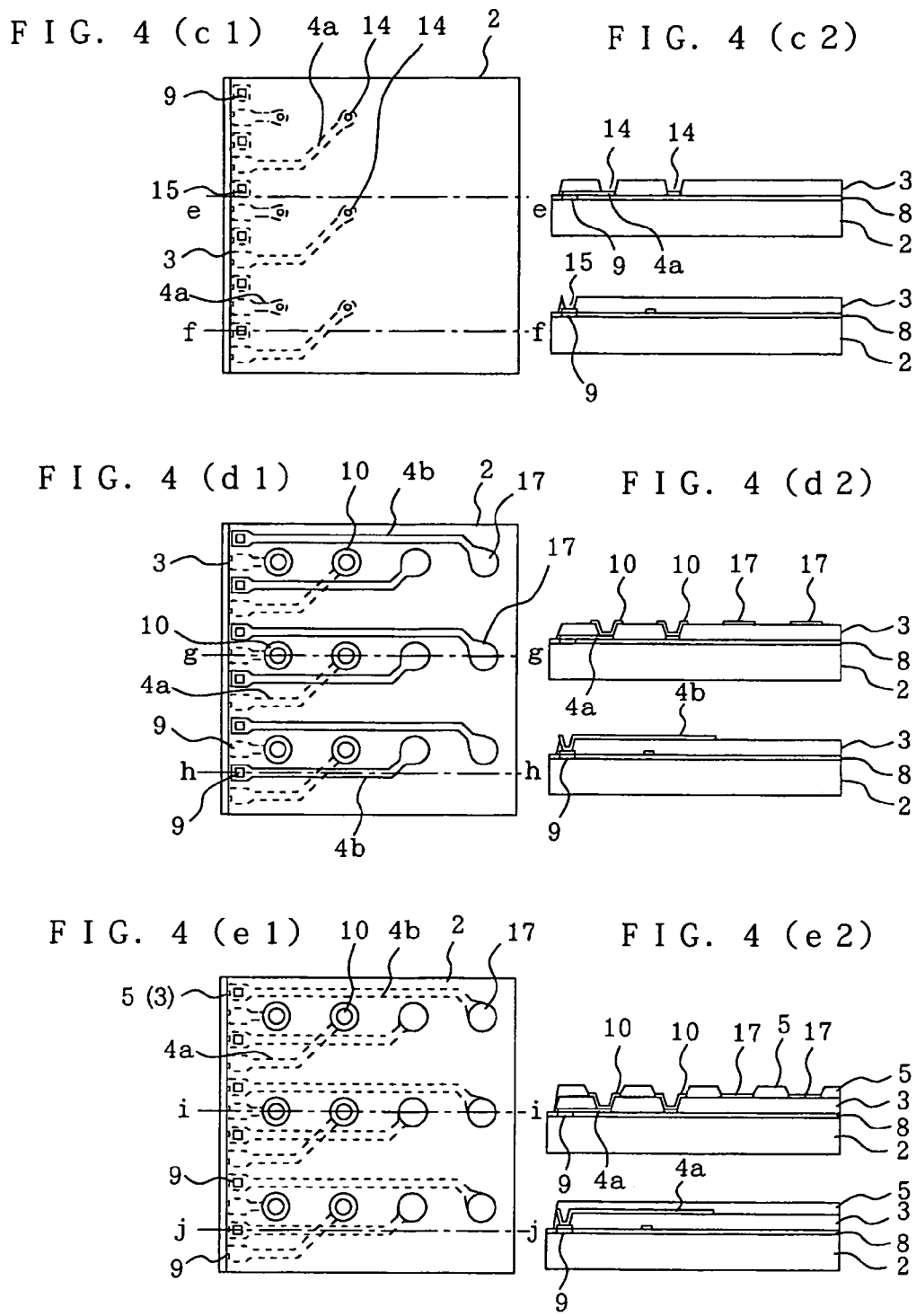

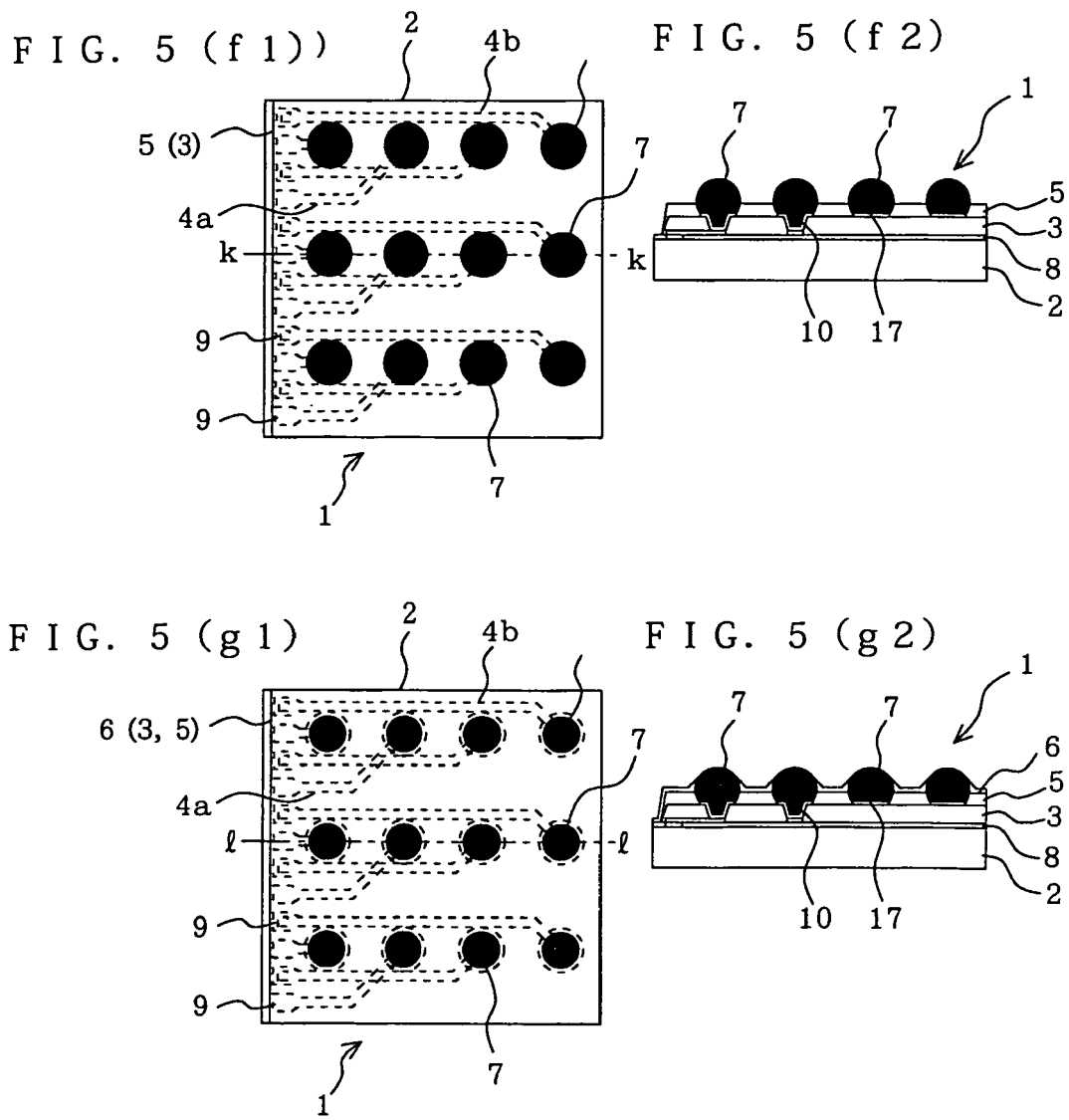

SEMICONDUCTOR DEVICE, METHOD OF MANUFACTURING THEREOF, CIRCUIT BOARD AND ELECTRONIC APPARATUS

RELATED APPLICATIONS

This application claims priority to Japanese Patent Application No. 2003-419405 filed Dec. 17, 2003 which is hereby expressly incorporated by reference herein in its entirety.

BACKGROUND

1. Technical Field

The present invention relates a semiconductor device and a method of manufacturing the same, a circuit substrate and an electronic apparatus. In particular, the present invention relates to a semiconductor device and a method of manufacturing in which many external terminals can be formed and circuit substrate and an electronic apparatus in which the semiconductor device is installed.

2. Related Art

To mount a semiconductor device with high density, it is preferable to mount a semiconductor chip as it is without packaging such as bare mounting. In bare chip mounting, however, it is insufficient to protect a semiconductor chip and hard to handle it. Hence, a semiconductor device using a chip size package (CSP) is proposed and a wafer level CSP in which a diced wafer becomes a semiconductor device has recently developed. In this wafer level CSP, resin layers and wirings are formed on a surface of a silicon wafer in which tiny transistors are fabricated. This silicon wafer is cut into individual semiconductor devices.

In the conventional method of manufacturing a semiconductor device using a wafer level CSP, when a resin layer is formed on a surface of a silicon wafer, a resin layer is not formed in a portion which is diced so as to avoid loosing a resin layer and cracking an end area of a semiconductor device (See International Patent Publication No. 01-071805 pamphlet (FIG. 1 and FIG. 14)).

In the conventional method of manufacturing a semiconductor device using a wafer level CSP, however, a resin layer and an external terminal are formed close to the center of a semiconductor element and the external terminal is coupled to a wiring extending from an electrode formed in a circumference of the semiconductor device. In this case, wirings are formed only on a surface of a resin layer such that an area of a portion in which wirings and external terminals are formed is small and it is difficult to form many external terminals and it is uneasy to realize highly dense wirings and external terminals.

The present invention is intended to provide a semiconductor device and a method of manufacturing in which wirings and external terminals can be formed with high density, a circuit substrate and an electronic apparatus in which the semiconductor device is installed.

SUMMARY

A semiconductor device of the present invention comprises: a semiconductor element including a plurality of electrodes; a plurality of resin layers; a plurality of wirings electrically coupled to the electrodes; and a plurality of external terminals electrically coupled to the wirings. First wirings of the plurality of wirings are formed at the bottom of a first resin layer (or a plurality of multiple-deposited resin layers). Second wirings of the plurality of wirings (which are different from the first wirings) are formed on top of the first resin layer (or the plurality of multiple-deposited resin layers). In this way, an area for forming the wirings can be expanded and many wirings and external terminals can be formed. Further, the first and second wirings are formed to overpass or underpass one another (i.e., cross) so as to enable the external terminals to be highly concentrated.

Further, in the semiconductor device of the present invention, a metal film made of the same material as the first wirings may be formed on the surface of each electrode which is not coupled to the first wirings. Forming a metal film made of the same material as the first wirings on the surface of each electrode which is not coupled to the first wirings can avoid oxidization or corrosion of the electrode.

Further, in the semiconductor device of the present invention, the first wirings are coupled to the external terminals located at least at the most outer circumference of the semiconductor element. A large stress is applied to an area close to an outer circumference of a semiconductor element by thermal energy and the like. Therefore, the first wirings which are relatively difficult to disconnect are coupled to the external terminals located at least at the most outer circumference of the semiconductor element to resist disconnection.

In the semiconductor device of the present invention, the semiconductor device may be packaged with a chip size packaging (CSP) method. As such, highly dense wirings and external terminals can be realized.

In the semiconductor device of the present invention, the external terminals may comprise solder balls. As such, external terminals made of highly concentrated solder balls can be provided.

In the semiconductor device of the present invention, a bore hole (i.e., a through bore) may be formed in the first resin layer. As such, the first wirings formed on the bottom of the first resin layer can be easily coupled to the external terminals and the coupling reliability can be improved.

In the semiconductor device of the present invention, the semiconductor device may be manufactured by cutting a silicon wafer including integrated semiconductor elements by dicing. By cutting a silicon wafer in which tiny transistors and the like are formed, for example, by dicing, many semiconductor devices can be obtained from a single silicon wafer.

In the semiconductor device of the present invention, at least one resin layer of the plurality of resin layers may be formed in a region spaced apart from the portion to be cut by dicing. As such, cracking at an end area of the semiconductor device and the loosening of a resin layer can be avoided.

In the semiconductor device of the present invention, at least one resin layer may be formed in a region in which the electrodes are formed. As such, an area for forming external terminals can be expanded and many external terminals can be formed.

A method of manufacturing a semiconductor device including a semiconductor element having a plurality of electrodes; a plurality of resin layers, a plurality of wirings, and a plurality of external terminals coupled to the wirings, comprises the steps of forming first wirings (which are part of the plurality of wirings) on the semiconductor element; forming at least one resin layer on the first wirings; and forming second wirings (which are different from the above first wirings) on the resin layer. As such, an area for forming the wirings can be expanded to both sides of the resin layer and many wirings and external terminals can be formed. Further, the wirings may be formed so as to cross one another (overpass or underpass) to enable the external terminals to be highly concentrated.

In a circuit board of the present invention, the above mentioned semiconductor device is installed. The circuit board is provided with any of the above semiconductor devices in which the external terminals are formed with high concentration so as to realize miniaturization and high performance.

In an electronic apparatus of the present invention, any of the above mentioned semiconductor devices is installed. The electronic apparatus is provided with any of the above semiconductor device so as to realize miniaturization and high performance.

BRIEF DESCRIPTION OF THE DRAWINGS

FIG. 2 is a plan view showing a silicon wafer as an integration of semiconductor elements.

FIGS. 3(a1)–(b2) are plan and longitudinal sectional views of a second embodiment of the invention.

FIGS. 4(c1)–(e2) are plan and longitudinal sectional views in a process continued from FIG. 3(b2).

FIGS. 5(f1)–(g2) are plan and longitudinal sectional views in a continued process followed by FIG. 4.

DETAILED DESCRIPTION

First Embodiment

Figure 1:
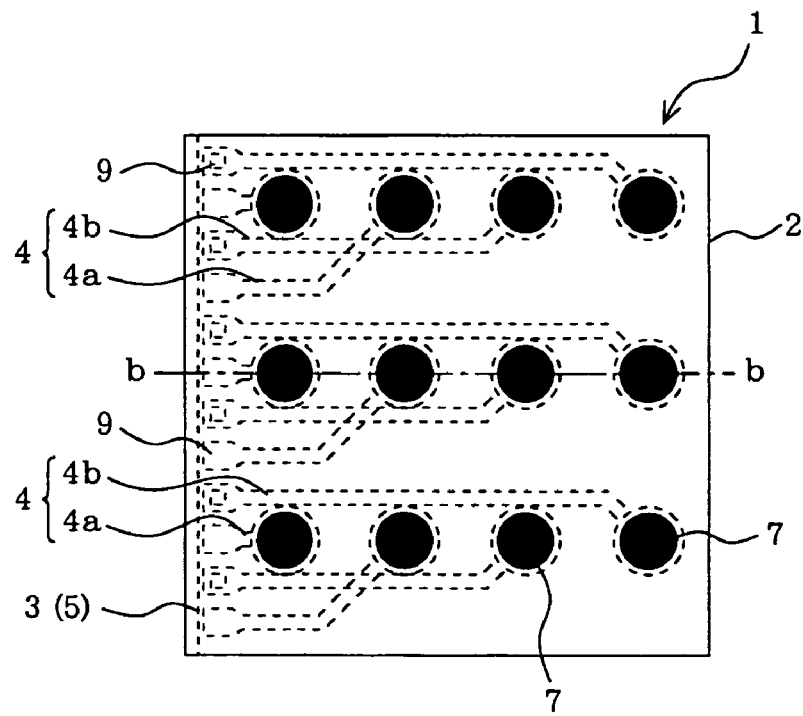
FIGS. 1A–C are plan views and a longitudinal sectional view a first embodiment of the invention.
Figure 1:
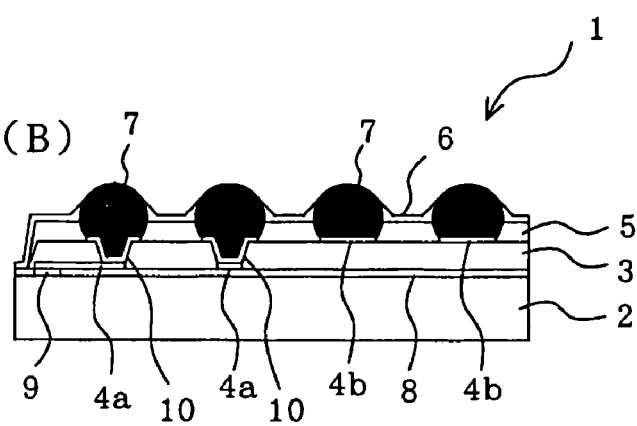
Figure 1:
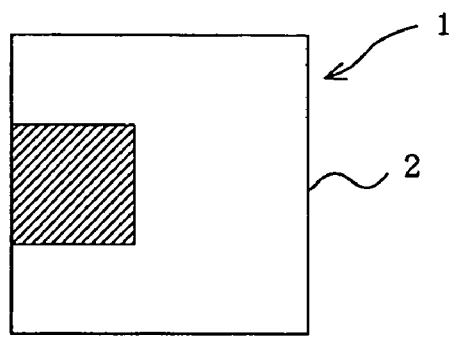

FIG. 1 includes plan views and a longitudinal sectional view of a first embodiment of the invention. FIGS. 1A and 1B show part of a semiconductor device 1, namely a part corresponding to the shaded portion of FIG. 1C. In other portions of the semiconductor device 1 shown in FIG. 1C, the structure shown in FIG. 1A is substantially symmetrically formed. Note that some parts are shown in phantom in FIG. 1A. FIG. 1B is a longitudinal sectional view along the line b—b shown in FIG. 1A. The semiconductor device 1 of embodiment 1 mainly comprises a first resin layer 3, wirings 4, a second resin layer 5, a third resin layer 6 and external terminals 7 on one surface of a semiconductor element 2. The wirings 4 include first wirings 4a and second wirings 4b. The first wirings 4a are formed between the semiconductor element 2 and the first resin layer 3. The second wirings 4b are formed on the upper surface of the first resin layer 3. As used herein, the upper surface of the first resin layer 3 faces the external terminals 7. Thus, the first wirings 4a are formed along a bottom surface of the first resin layer 3 (adjacent the semiconductor element 2) while the second wirings 4b are form along the upper surface of the first resin layer 3 (adjacent the external terminals 7 and spaced apart from the semiconductor element 2). A passivation film 8 and electrodes 9 may be formed directly on one surface of the semiconductor element 2 and the first wirings 4a may be formed directly on the surface of the passivation film 8 and the electrodes 9.

The electrodes 9 are provided as a plurality of electrodes discretely coupled to the plurality of wirings 4. Namely, each wiring 4 is provided corresponding to an external terminal 7 to electrically couple the external terminal 7 with the electrodes 9. In embodiment 1, a third resin layer 6 is formed for reinforcing the external terminals 7. However, the third resin layer 6 is not essential.

In the semiconductor element 2, many tiny transistors and the like are formed by pre-processing a silicon wafer. The first resin layer 3 and the external terminals 7 are formed on a silicon wafer and the silicon wafer is thereafter cut by dicing so as to form each semiconductor device 1. As such, the diced silicon wafer becomes the semiconductor devices without modification. This is called as a wafer level CSP. The wafer level CSP is one type of a packaging method known as CSP but further advances miniaturization as compared to conventional CSP. In embodiment 1, silicon (mainly mono. crystalline) is preferably used as the material of the semiconductor device 2. However, other semiconductor materials such as gallium arsenide and the like can be used.

The thin passivation film 8 and electrodes 9 may be made of. aluminum and the like. The passivation film 8 and electrodes 9 are formed on one surface of the semiconductor element 2. The first wirings 4a and the first resin layer 3 are formed on the surface of the passivation film 8. In embodiment 1, a plurality of electrodes 9 are placed along the circumference of the semiconductor element 2 and the first resin layer 3 is also formed over part of the electrodes 9. Thus, forming the first resin layer 3 can expand a region for forming the external terminals 7 and enables many external terminals 7 to be formed. Further, the first resin layer 3 is not formed all the way to the outer circumference of the semiconductor element 2. As the material for the first resin layer 3, at least a polyimide resin, silicon denaturation of polyimide resin, epoxy resin, silicon denaturation of epoxy resin, phenolic resin, acrylic resin, benzocyclo butene (BCB) and polybenzoxazole (PBO) may be used.

As described above, a part of the wirings 4 forms the first wirings 4a and the remaining parts of the wirings 4 (except the part forming the first wiring 4a) form the second wirings 4b. The first wirings 4a are coupled to some of the plurality of electrodes 9 and the first wirings 4a are formed along a side of the first resin layer 3 adjacent the semiconductor device 2. The second wirings 4b are coupled to the remaining electrodes 9 and the second wirings 4b are formed along a side of the first resin layer 3 adjacent the external terminals 7. Here, the second wirings 4b are coupled to the electrodes 9 via a second bore hole (through bore) which is explained in detail in the second embodiment of the invention below. The second bore hole is formed over the electrodes 9 in the first resin layer 3 and extends up to the surface adjacent the external terminals 7. Further, the first wirings 4a are connected to the external terminals 7 via first lands 10 (explained in the second embodiment in detail). If all of the wirings 4 are formed on the surface of the resin layer 3 adjacent the external terminals 7, an area for forming the wirings 4 becomes small and the wirings 4 cannot cross each other (overpass or underpass). As such, the wirings 4 and external terminals 7 can not be formed with a high concentration. On the other hand, in embodiment 1, the wirings 4 are formed adjacent both surfaces of the first resin layer 3 so as to realize highly concentrated wirings 4 and external terminals 7.

The first wirings 4a may be made of multi-layers including a titanium and tungsten alloy layer and a copper layer. The second wirings 4b may also be formed in the same manner as the first wirings 4a. However, it is preferable that the second wirings 4b be formed by copper plating. In embodiment 1, the first resin layer 3 is formed between the first wrings 4a and the second wirings 4b. It is preferred that a plurality of resin layers are employed and another material is interposed therein. In embodiment 1, the first wirings 4a are formed on the surface of the passivation film 8. It is preferable that another resin film is formed between the first wirings 4a and the semiconductor element 2.

A second resin layer 5 is formed on the semiconductor element 2, the first wirings 4a, the first resin layer 3 and the second wirings 4b. The second resin layer 5, however, is not formed all the way to the outer circumference of the semiconductor element 2, on the first lands 10 and a region (a second land which will be explained in embodiment 2 in detail) where the external terminals 7 corresponding to the wirings 4b are formed. The second resin layer 5 is not formed in the outer circumference of the semiconductor element 2 so as to prevent cracking of an end area of the semiconductor device 1 and loosening a resin layer by avoiding the area that will be cut when dicing the silicon wafer to yield the semiconductor element 1. As the material for the second resin layer 5, the same material as the first resin layer 3 may be used or a different material may be used.

The external terminals 7 made of solder balls are formed on the first lands 10 and the second land (explained in the second embodiment). The external terminals 7 are used for connecting the semiconductor device 1 to a circuit board and are preferably made of a lead-free solder, for example. Further, the third resin layer 6 may be formed on the upper surface and the side of the second resin layer 5 as illustrated in FIG. 1B. The third resin layer 6 is formed mainly for reinforcing the external terminals 7 so that a circumferential area of the external terminals 7 slopes outwardly. Further, the third resin layer 6 is formed to expose a part of each external terminal 7. Here, as the material for the third resin layer 6, the same material as the first resin layer 3 may be used or a different material may be used. It is preferable that the elasticity of the first resin layer 3, the second resin layer 5 and the third resin layer 6 respectively lowers in this order. Thus, the resin layers sequentially have a lower elasticity from the semiconductor element 2 to the external element 7 so as to effectively relax the stress and the like applied to the external terminals 7 by thermal stress.

In embodiment 1, the first wirings 4a, which are a part of the plurality of wirings 4, are formed at the bottom of the first resin layer 3 and the second wirings 4b, which are another part of the plurality of wirings 4 but different from the first wirings 4a, are formed at the top of the first resin layer 3. As such, an area for forming the wirings 4 can be expanded and many wirings 4 and external terminals 7 can be formed. Further, the first wirings 4a are formed on the surface of the passivation film 8 and there is no need to provide a step for enabling fine wiring.

Second Embodiment

FIG. 2 is a plan view showing a silicon wafer integrating a plurality of semiconductor elements 2. After completing the manufacturing process of the semiconductor device shown in FIG. 3 through FIG. 5, the silicon wafer 11 is cut by dicing so as to form each semiconductor device 1. FIG. 3 through FIG. 5 show a part close to the side of a semiconductor element 2, which is the shaded portion in FIG. 2. Here, the processes shown in FIG. 3 through FIG. 5 are completed for other portions of the semiconductor device 1.

FIGS. 3, 4 and 5 are partial plan views and partial longitudinal cross sectional views showing the manufacturing process for a semiconductor device of embodiment 2 of the invention. Here, the manufacturing method shown in embodiment 2 is to manufacture the semiconductor device shown in embodiment 1. In FIGS. 3, 4 and 5, the second resin layer 5 and the third resin layer 6 are illustrated as being transparent similar to FIG. 1A. First, the passivation film 8 and the electrodes 9 are formed on a silicon wafer provided with many tiny transistors via pre-processing (FIG. 3(a1)). FIG. 3(a2) is a longitudinal sectional view along the line c—c shown in FIG. 3(a1). The passivation film 8 is formed in an area except a portion for the electrodes 9 on a side surface of the semiconductor element 2. Electrodes 9 are formed adjacent the outer circumference of the semiconductor element 2.

Then, the first wirings 4a are formed to be coupled to some of the electrodes 9 on the semiconductor element 2 (FIG. 3(b1)). FIG. 3(b2) is a longitudinal sectional view along the line d—d shown in FIG. 3(b1). At this time, it is preferable that another end of some of the first wirings 4a coupled to the electrodes 9 has a slightly enlarged or swollen shape. Further, a metal film may be formed on the surface of the electrodes 9 which are not coupled to the first wirings 4a during the process of FIG. 3(b1) to avoid oxidization or corrosion. The material for the metal film is preferably the same as the first wirings 4a. It is preferable that the first wirings 4a are coupled to external terminals 7 and electrodes 9 along the outer circumference of the semiconductor element 2. The external terminals 7 and the wirings 4 are easily disconnected by large stresses such as the thermal stress in the outer circumference of the semiconductor element 2. The first land 10, however, is formed as described later so that it is difficult to disconnect the connecting portion of the external terminals 7 due to relaxation of the stress. In embodiment 2, as shown in FIG. 5, it is preferable that the external terminal 7 located at the outer circumference of the semiconductor device 2 and the external terminal 7 located immediate inboard thereof are coupled to the first wirings 4a. The first wirings 4a are formed by forming a titanium and tungsten alloy layer and a copper layer on the surface of the passivation film 8 by sputtering, for example, thereafter coating the alloy with a resist film having a predetermined shape (not shown), leaving the alloy in the area defining the first wirings 4a via etching, and then removing the resist layer.

Further, the first resin layer 3 is formed on the surface of the passivation film 8 on which the wirings 4a are formed during the process of FIG. 3(b1) (also see FIG. 4(c1)). At this time, the first resin layer 3 is also formed on a part of the first wirings 4a and electrodes 9. Thus, forming the first resin layer 3 on a part of electrodes 9 can expand a region for forming the external terminals 7 and enables many external terminals 7 to be formed. Further, the first resin layer 3 is not formed at the outer circumference of the semiconductor element 2. Further, the first resin layer 3 may not be formed on a part of electrodes 9. FIG. 4(c2) is a longitudinal sectional view along the lines e—e and f—f shown in FIG. 4(c1). First bore holes 14 are formed in an end part of the fist resin layer 3 in which the first wirings 4a are coupled to electrodes 9. Second bore holes 15 are formed in an upper part of the resin layer 3 in which the first wirings 4a are not coupled to electrodes 9.

The second wirings 4b are formed on the surface of the first resin layer 3 so as to couple the remaining external terminals 7 with electrodes 9. The first lands 10 are formed on a part of the first bore holes 14 (FIG. 4(d1)). At this time, another end of a part of the second wirings 4b coupled to electrodes 9 has a slightly enlarged or swollen shape to form the second lands 17 in which the external terminals 7 will be formed. The second wirings 4b are coupled to electrodes 9 via the second bore holes 15. FIG. 4(d2) is a longitudinal sectional view along the lines g—g and h—h shown in FIG. 4(*d*1). The second wirings 4*b* may be formed by the same process as the first wirings 4*a*. However, it is preferable that copper plating is added over the titanium and tungsten alloy layer and the copper layer. Further, the first lands 10 may be formed similar to the process for forming the second wring 4*b*.

The second resin layer 5 is formed on the surface of the first resin layer 3 and the second wirings 4*b* (FIG. 4(*e*1)). At this time, the second resin layer 5 is not formed at the outer circumference of the semiconductor element 2, on the first lands 10 and the second lands 17 (FIG. 4(*e*2)). FIG. 4(*e*2) is a longitudinal sectional view along the lines i—i and j—j shown in FIG. 4(*e*1). A part of the first lands 10 in which the second resin layer 5 is not formed may be expanded so as to increase the reliability of the connection of the external terminals 7. The external terminals 7 made of solder balls are formed in the area of the first lands 10 and the second lands 17 (FIG. 5(*f*1)). The external terminals 7 are made of lead free solder for example and formed by solder ball transferring, paste printing and plating. FIG. 5(*f*2) is a longitudinal sectional view along the line k—k shown in FIG. 5(*f*1).

Further, the third resin layer 6 is formed on the surface and the side of the second resin layer 5 (FIG. 5(*g*1)). FIG. 5(*g*2) is a longitudinal sectional view along the line 1—1 shown in FIG. 5(*g*1). In this case, the third resin layer 6 is formed to expose a part of each external terminal 7. It should be noted that the third resin layer 6 is not necessarily needed. Finally, after completing the manufacturing processes shown in FIG. 5(*f*1) through FIG. 5(*g*1), the silicon wafer is cut by dicing so as to form each semiconductor device 1. In the above manufacturing processes, the first resin layer 3 and the second resin layer 5 are not formed in the area in which a silicon wafer is diced so that these resin layers are not cut. This prevents cracking the end of the semiconductor element 2 and loosening or removing the resin layers.

In embodiment 2, the first wirings 4*a*, which are a part of the plurality of wirings 4, are formed and thereafter the first resin layer 3 is formed on the surface of the first wirings 4*a*. The second wirings 4*b*, which are different from the first wirings 4*a*, are formed on the surface of the first resin layer 3 opposite the first wirings 4*a*. An area for forming the wirings 4 is expanded to both surfaces of the first resin layer 3 so that many wirings 4 and external terminals 7 can be formed. Further, the wirings 4 are formed so as to cross by overpassing or underpassing one another so as to enable external terminals to be highly concentrated.

Third Embodiment

Figure 6:
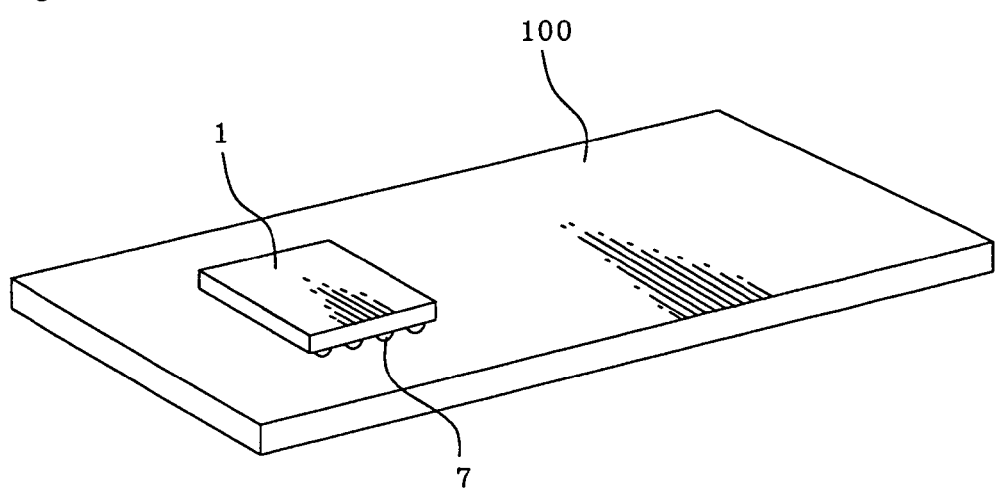
FIG. 6 is a perspective view of an example of a circuit substrate accoding to embodiment 3 of the invention.

FIG. 6 is a perspective view schematically showing an example of a circuit board according to a third embodiment of the invention. In the circuit board 100 shown in FIG. 6, the semiconductor device according to embodiment 1 of the invention is mounted. The circuit board 100 is made of a glass epoxy substrate and wiring patterns such as copper and the like are formed in advance. The external terminals 7 of the semiconductor device 1 are coupled to the circuit board 100 so as to be electrically conducted and perform predetermined processing (data processing for example).

Figure 7:
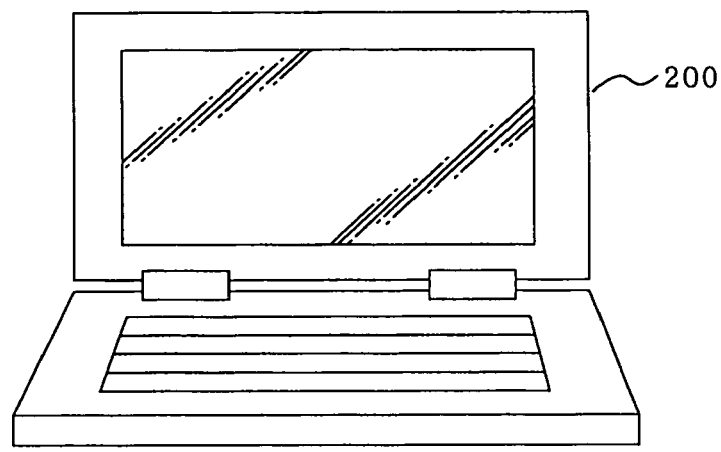
FIGS. 7A and B are examples of electornic appratuses of embodiment 3 of the invention.
Figure 7:
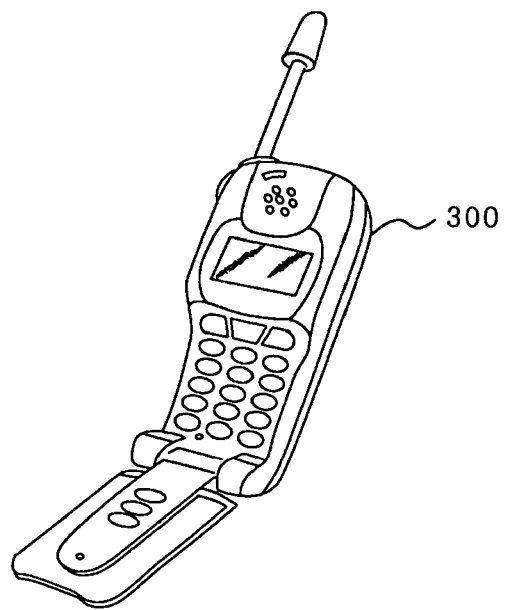

FIG. 7 is an example of an electronic apparatus according to a third embodiment of the invention. The electronic apparatus shown in FIG. 7 has the semiconductor device 1 according to embodiment 1 of the invention. FIG. 7A shows an example in which the semiconductor device 1 is applied to a personal computer 200 and FIG. 7B is an example in which the semiconductor device 1 is applied to a cellar phone 300. The semiconductor device 1 shown in embodiment 1 and the semiconductor device 1 shown the manufacturing method of embodiment 2 can be applied to other electronic devices.

What is claimed is:

1. A semiconductor device comprising:
   a semiconductor element including a plurality of electrodes aligned along a circumferential edge thereof;
   first wirings formed on the semiconductor element and having first ends electrically coupled to a first set of the plurality of electrodes;
   a first resin layer formed on the first wirings;
   second wirings formed on the first resin layer and having first ends electrically coupled to a second set of the plurality of electrodes, the first and second wirings crossing one another and separated by the first resin layer; and
   a plurality of external terminals electrically coupled to second ends of the first and second wirings.

2. The semiconductor device according to claim 1, wherein a metal film made of the same material as the first wiring is formed on at least one of the electrodes which is not coupled to the first wirings.

3. The semiconductor device according to claim 1, wherein at least some of the first wirings are electrically coupled the external terminals located at an outermost circumferential position on the semiconductor element relative to other external terminals.

4. The semiconductor device according to claim 1, wherein the semiconductor device is packaged with a chip size packaging method.

5. The semiconductor device according to claim 1, wherein the external terminals comprise solder balls.

6. The semiconductor device according to claim 1, wherein a bore hole is formed in the resin layer and at least one of the first and second wirings are coupled to at least one of the external terminals through the bore hole.

7. The semiconductor device according to claim 1, wherein the semiconductor device is manufactured by cutting a silicon wafer.

8. The semiconductor device according to claim 7, wherein the resin layer is spaced apart from a region of the silicon wafer to be cut.

9. The semiconductor device according to claim 1, further comprising a plurality of resin layers on the semiconductor element and wherein at least one of the plurality of resin layers is formed in a region in which the electrodes are formed.

10. A circuit substrate including the semiconductor device according to claim 1.

11. An electronic apparatus including the semiconductor device according to claim 1.

* * * * *